(12) United States Patent
Do

(10) Patent No.: US 7,586,803 B2
(45) Date of Patent: Sep. 8, 2009

(54) SEMICONDUCTOR MEMORY DEVICE WITH REDUCED SENSE AMPLIFICATION TIME AND OPERATION METHOD THEREOF

(75) Inventor: Chang-Ho Do, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 68 days.

(21) Appl. No.: 12/006,166

(22) Filed: Dec. 31, 2007

(65) Prior Publication Data

US 2008/0239849 A1   Oct. 2, 2008

(30) Foreign Application Priority Data

Apr. 2, 2007   (KR) .................... 10-2007-0032536

(51) Int. Cl.
*G11C 7/00* (2006.01)
*G11C 7/02* (2006.01)
(52) U.S. Cl. .................... 365/205; 365/208; 327/57
(58) Field of Classification Search ............... 365/205
See application file for complete search history.

(56) References Cited

U.S. PATENT DOCUMENTS

| | | | | |
|---|---|---|---|---|
| 5,615,161 A * | 3/1997 | Mu | .............. | 365/208 |
| 5,768,201 A | 6/1998 | Oh | | |
| 5,854,562 A * | 12/1998 | Toyoshima et al. | ........... | 327/55 |
| 5,883,846 A * | 3/1999 | Lee | .............. | 365/207 |
| 5,963,495 A * | 10/1999 | Kumar | .............. | 365/207 |
| 6,107,839 A * | 8/2000 | Chu et al. | .............. | 327/51 |
| 6,317,374 B2 * | 11/2001 | Feurle | .............. | 365/205 |
| 6,400,186 B1 * | 6/2002 | Bailey et al. | .............. | 327/55 |
| 6,445,621 B1 * | 9/2002 | Heightley | .............. | 365/189.11 |
| 6,480,037 B1 * | 11/2002 | Song et al. | .............. | 327/55 |
| 6,492,844 B2 * | 12/2002 | Terzioglu et al. | .............. | 327/52 |
| 6,711,079 B2 * | 3/2004 | Kang | .............. | 365/207 |
| 7,002,862 B2 | 2/2006 | Kang | | |
| 7,046,045 B2 * | 5/2006 | Nakazato et al. | .............. | 327/55 |
| 7,088,630 B2 * | 8/2006 | Hung et al. | .............. | 365/185.2 |
| 7,209,399 B2 * | 4/2007 | Chun et al. | .............. | 365/205 |
| 7,263,016 B1 * | 8/2007 | Palumbo et al. | .............. | 365/205 |
| 7,298,180 B2 * | 11/2007 | Hung | .............. | 327/57 |

(Continued)

FOREIGN PATENT DOCUMENTS

JP        2002-230978        8/2002

(Continued)

*Primary Examiner*—Son L Mai
(74) *Attorney, Agent, or Firm*—Blakely, Sokoloff, Taylor & Zafman LLP

(57) ABSTRACT

A semiconductor memory device is capable of swiftly sensing data loaded on local I/O lines and transferring the sensed data to a global I/O line, thereby reducing an operating time of a sense amplifier by increasing the sensing and amplifying speed. The semiconductor memory device includes a sense amplifying unit, a precharging unit, a charge sharing unit, and a driving unit. The sense amplifying unit amplifies data applied to a first data line in response to an I/O strobe signal. The precharging unit precharges an output unit of the sense amplifying unit in response to a precharge signal. The charge sharing unit performs a charge sharing operation between the first data line and the output unit before a sense amplifying operation of the sense amplifying unit. The driving unit drives a second data line in response to an output signal of the sense amplifying unit.

25 Claims, 6 Drawing Sheets

U.S. PATENT DOCUMENTS

2002/0048207 A1* 4/2002 Kang .................... 365/207
2004/0240293 A1 12/2004 Lee
2005/0036395 A1* 2/2005 Maejima et al. ............ 365/232
2008/0123455 A1* 5/2008 Choi .................... 365/207

FOREIGN PATENT DOCUMENTS

KR  10-2004-0015616 A  2/2004
KR  10-2006-0004138 A  1/2006

* cited by examiner

SEMICONDUCTOR MEMORY DEVICE WITH REDUCED SENSE AMPLIFICATION TIME AND OPERATION METHOD THEREOF

CROSS-REFERENCE TO RELATED APPLICATIONS

The present invention claims priority to Korean patent application number. 10-2007-0032536, filed on Apr. 2, 2007, which is incorporated by reference in its entirety.

BACKGROUND OF THE INVENTION

The present invention relates to a semiconductor design technology, and more particularly to a semiconductor memory device capable of rapidly transferring data, which are applied to local I/O lines, to a global I/O line.

A plurality of memory banks are provided within a semiconductor memory device such as a DDR SDRAM (Double Data Rate Synchronous DRAM) and each memory bank is comprised of a set of a plurality of memory cells each of which has a cell transistor and a cell capacitor. Herein, an area in which the memory bank is positioned is called "core area" and an area to input and output the data to and from the memory bank is called "peripheral area." The data transferred from the peripheral area at a write operation are inputted into the core area through a write driver which is positioned in the vicinity of the core area and the data are outputted from the core area to the peripheral area through an I/O sense amplifier.

Generally, a global I/O line is a data line to be coupled between a data I/O pin and an I/O sense amplifier and a local I/O line is a data line to be coupled between the core area and an I/O sense amplifier.

FIG. 1 is a circuit diagram illustrating a conventional I/O sense amplifier. The conventional I/O sense amplifier includes a sense amplifying unit 110 for sensing and amplifying data applied to positive/negative local I/O lines LIO and LIOb in response to the I/O strobe signal IOSTP, a precharging unit 130 for precharging first and second output terminals OUT and OUTb of the sense amplifying unit 110 in response to the I/O strobe signal IOSTP, and a pull-up/pull-down driving unit 150 for pull-up and pull-down driving the global I/O line GIO in response to a voltage level of the first and second output terminals OUT and OUTb of the sense amplifying unit 110.

The sense amplifying unit 110 includes a differential input unit 112 for receiving differential data applied to the positive/negative local I/O lines LIO and LIOb, a differential amplifier 114 for amplifying the differential data inputted from the differential input unit 112, and an activation unit 116 for enabling the differential input unit 112 in response to the I/O strobe signal IOSTP.

The I/O sense amplifying unit is a circuit which senses and amplifies a minute voltage level difference between the data applied to the positive/negative local I/O lines LIO and LIOb. Therefore, in order to properly sense the minute voltage level difference of the differential data, there is provided a minimum voltage level difference Δt between the positive/negative local I/O lines LIO and LIOb. With the minimum voltage level difference Δt, the differential input unit 112 is activated, the data loaded on the positive/negative local I/O lines LIO and LIOb are amplified, and then the amplified data are transferred to the global I/O line GIO.

FIG. 2 is a timing diagram illustrating an operation of each signal of FIG. 1. In FIG. 2, there are shown voltage levels of the positive/negative I/O lines LIO and LIOb, the I/O strobe signal IOSTP, the first and second output terminals OUT and OUTb, and the global I/O line GIO.

An operation of the conventional sense amplifier will be illustrated below referring to FIGS. 1 and 2. For the sake of convenience in illustration, it is assumed that logic high data is transferred through the positive local I/O line LIO and logic low data is transferred through the negative I/O line LIOb.

First, before a read command RD is inputted to the semiconductor memory device, the I/O strobe signal IOSTP is maintained in a low level. Accordingly, an NMOS transistor NM1 in the activation unit 116 is turned off, the current flowing toward a ground voltage level is blocked, and then the sense amplifier is in a standby state. Two PMOS transistors PM1 and PM2 in the precharging unit 130 are turned on such that the first and second output terminals OUT and OUTb are precharged to a voltage level corresponding to an external voltage VDD.

When the read command RD is inputted, the voltage level of the negative local I/O line LIOb is more and more decreased. The I/O strobe signal IOSTP is activated to a high level after the time of tA which is required to guarantee the voltage level difference of ΔV between the positive and negative local I/O lines LIO and LIOb.

At this time, the two PMOS transistors PM1 and PM2 in the precharging unit 130 are turned off so that the first and second output terminals OUT and OUTb are not precharged any more to the voltage level of the external voltage VDD. The NMOS transistor NM1 in the activation unit 116 is turned on so that the sense amplifying unit 110 senses the differential data having the voltage level difference of ΔV and the sensed data are outputted through the first and second output terminals OUT and OUTb.

An operation of the sense amplifying unit 110 will be described below. First, when the I/O strobe signal IOSTP is transited from a low level to a high level, an NMOS transistor NM2 of which the gate is connected to the negative local I/O line LIOb is gradually turned off so that an amount of the current flowing in the NMOS transistor NM2 is smaller than that in an NMOS transistor NM3 to be connected to the positive local I/O line LIO. An NMOS transistor NM5 connected to the first output terminal OUT of the differential amplifier 114 is strongly turned off more than an NMOS transistor NM4 connected to the second output terminal OUTb so that the voltage level of the second output terminal OUTb strongly turns on a PMOS transistor PM3 of which the source and drain are connected to the first output terminal OUT. Accordingly, the voltage level of the first output terminal OUT is increased and the voltage level of the second output terminal OUTb is decreased by an NMOS transistor NM4 which is turned on by the voltage level of the first output terminal OUT.

As a result, a high level of the first output terminal OUT turns off an NMOS transistor NM6 in the pull-up/pull-down driving unit 150 and a low level of the second output terminal OUTb turns on a PMOS transistor PM4 in the pull-up/pull-down driving unit 150, thereby pull-up driving the global I/O line GIO in the pull-up/pull-down driving unit 150.

On the contrary, when logic low data are transferred through the positive local I/O line LIO and logic high data are transferred through the negative local I/O line LIOb, the first output terminal OUT is in a low level and the second output terminal OUTb is in a high level, thereby pull-down driving the global I/O line GIO in the pull-up/pull-down driving unit 150.

Meanwhile, 'tD' in FIG. 2 is a time which is taken from the transition time, in which the I/O strobe signal IOSTP is transited from the low level to the high level, to the pull-up driving of the global I/O line GIO.

In other words, 'tA' is a time which is required to secure the voltage difference of ΔV for safely performing the sensing operation when the voltage difference between the positive local I/O line LIO and the negative local I/O line LIOb is amplified, and 'tD' is a time which is taken from the activation of the I/O strobe signal IOSTP to the pull-up and pull-down driving of the global I/O line GIO via the sense amplification. Accordingly, 'tA+tD' is a time taken by the data transmission time while the differential data, which are applied to the positive/negative local I/O lines LIO and LIOb, are transferred to the global I/O line GIO.

On the other hand, the read operation of the semiconductor memory device becomes slow if the time of 'tA+tD' gets longer. As a result, there is a problem in that the working speed of the chip becomes slow. Different kinds of plans are presented in order to satisfy this working speed of the semiconductor memory device these days. Further, the reduction in the time of 'tA+tD' may be improved to realize the high-speed operation of semiconductor memory device.

SUMMARY OF THE INVENTION

Embodiments of the present invention are directed to providing a semiconductor memory device capable of swiftly sensing data loaded on local I/O lines and transferring the sensed data to a global I/O line.

Also, embodiments of the present invention are directed to providing a semiconductor memory device capable of reducing an operating time of a sense amplifier by increasing the sensing and amplifying speed in the data input and output operation.

In one embodiment, a semiconductor memory device includes a sense amplifying unit for amplifying data applied to a first data line in response to an I/O strobe signal, a precharging unit for precharging an output unit of the sense amplifying unit in response to a precharge signal, a charge sharing unit for performing a charge sharing operation between the first data line and the output unit before a sense amplifying operation of the sense amplifying unit, and a driving unit for driving a second data line in response to an output signal of the sense amplifying unit.

In another embodiment, a method for driving a semiconductor memory device, which has a sense amplifying unit for sensing and amplifying data applied to a first data line, includes precharging an output unit of the sense amplifying unit in response to a precharge signal, amplifying the data applied to the first data line in response to an I/O strobe signal, and performing a charge sharing operation between the first data line and the output terminals of the sense amplifying unit in response to a charge sharing signal which is activated before amplifying the data applied to the first data line.

DESCRIPTION OF SPECIFIC EMBODIMENTS

Hereinafter, a semiconductor memory device in accordance with the present invention will be described in detail referring to the accompanying drawings.

Figure 1:
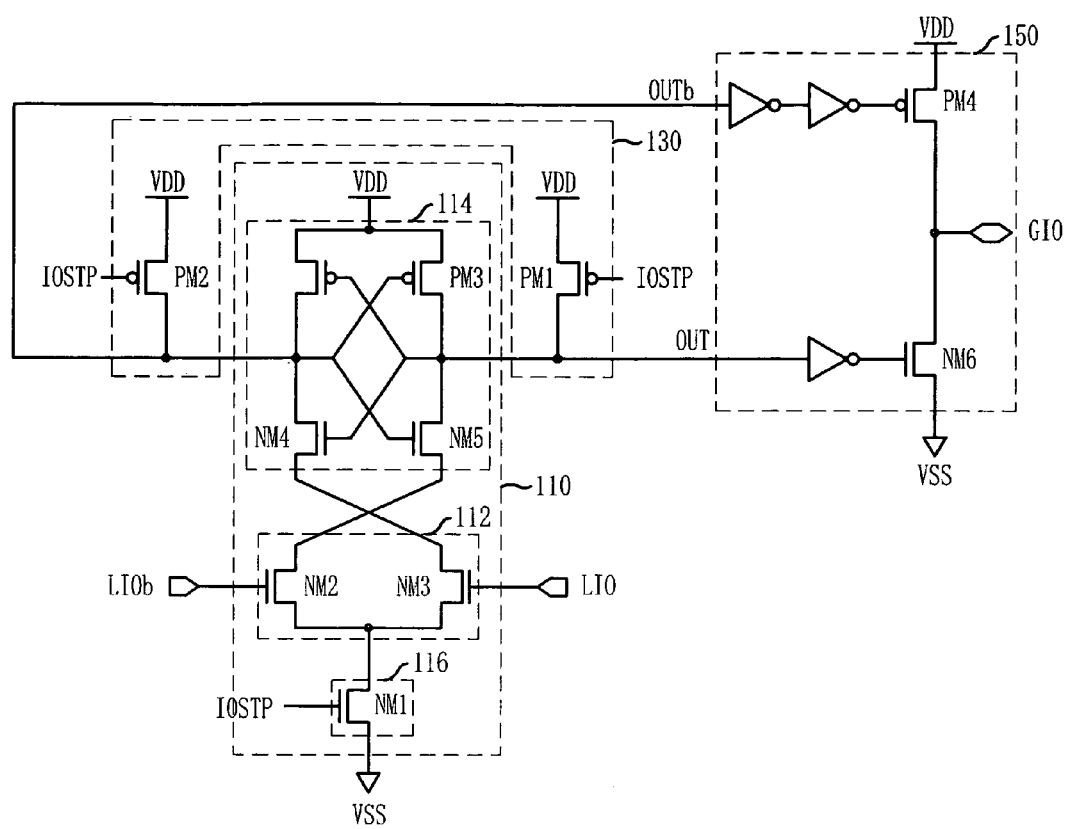
FIG. 1 is a circuit diagram illustrating a conventional I/O sense amplifier.
Figure 2:
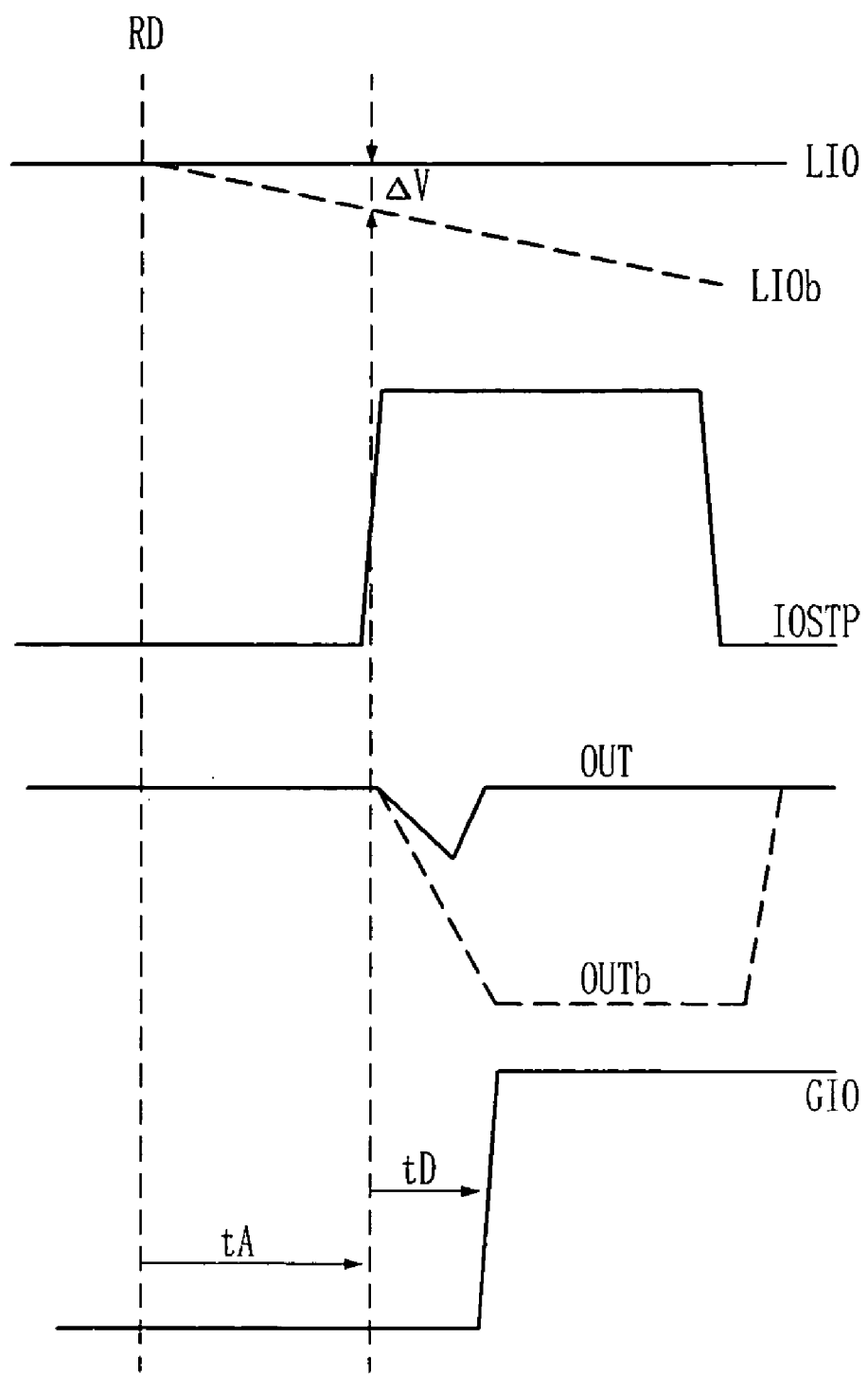
FIG. 2 is a timing diagram illustrating an operation of each signal of FIG. 1.
Figure 3:
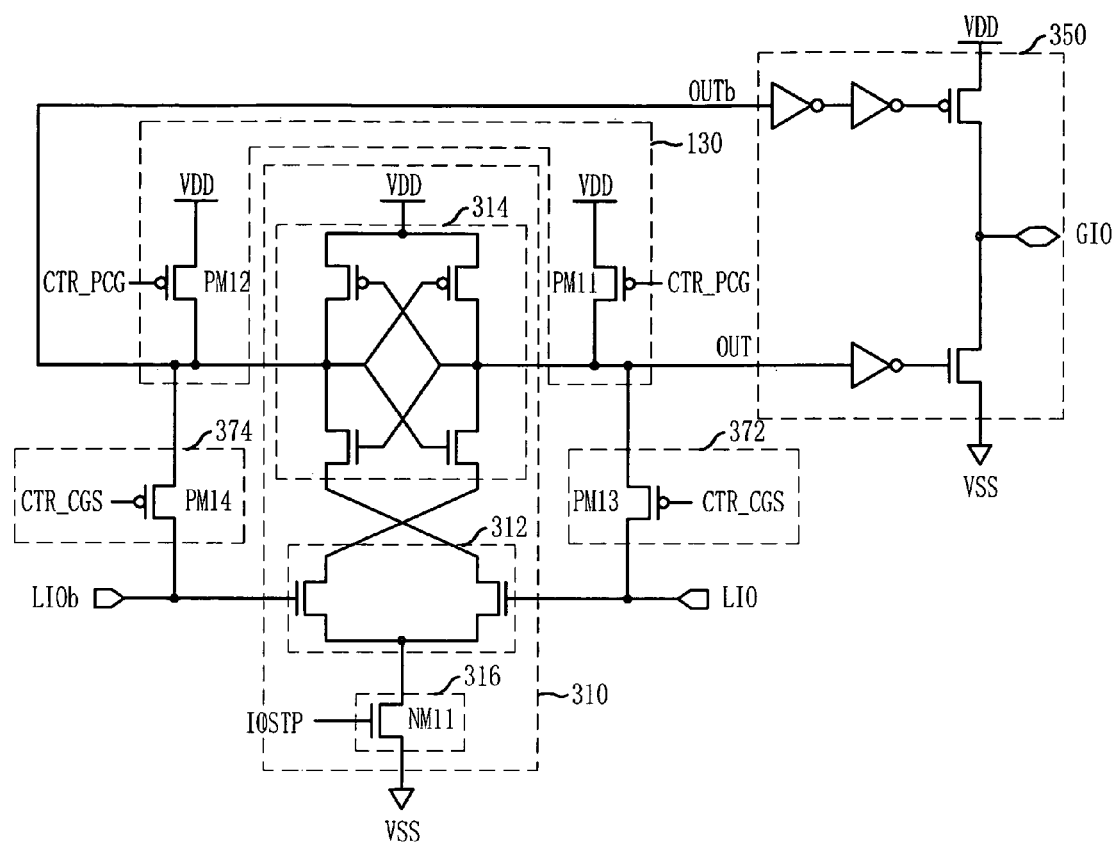
FIG. 3 is a circuit diagram illustrating an I/O sense amplifier according to the present invention.

FIG. 3 is a circuit diagram illustrating an I/O sense amplifier according to the present invention. A sense amplifying unit 310 senses and amplifies data, which are applied to positive and negative local I/O lines LIO and LIOb, in response to an I/O strobe signal IOSTP. A precharging unit 330 precharges the output terminals OUT and OUTb of the sense amplifying unit 310 in response to a precharge signal CTR_PCG. A charge sharing unit (including charge sharing elements 372 and 374) cause a charge sharing between the first and second output terminals OUT and OUTb and the corresponding positive/negative local I/O lines LIO and LIOb, before the sensing and amplifying section of the sense amplifying unit 310. A pull-up/pull-down driving unit 350 pull-up/pull-down drives the global I/O line GIO in response to an output signal of the sense amplifying unit 310.

The sense amplifying unit includes a differential input unit 312 for receiving differential data applied to the positive/negative local I/O lines LIO and LIOb, a differential amplifier 314 for amplifying the differential data inputted from the differential input unit 312, and an activation unit 316 for activating the differential input section 312 in response to the I/O strobe signal IOSTP. Preferably, the differential amplifier 314 is made up of a cross-coupled amplifier.

The precharging unit 330 includes a first PMOS transistor PM11 for precharging the first output terminal OUT of the sense amplifying unit 310 to a voltage level of an external supply voltage VDD in response to the precharge signal CTR_PCG, and a second PMOS transistor PM12 for precharging the second output terminal OUTb to the voltage level of the external supply voltage VDD in response to the precharge signal CTR_PCG.

The charge sharing unit includes a first charge sharing element 372 for charge sharing between the positive local I/O line LIO and the first output terminal OUT in response to a charge sharing signal CTR_CGS, and a second charge sharing element 374 for charge sharing between the negative local I/O line LIOb and the second output terminal OUTb in response to the charge sharing signal CTR_CGS.

The first charge sharing element 372 includes a third PMOS transistor PM13 having a source-drain connection between the first output terminal OUT and the positive local I/O line LIO and a gate to receive the charge sharing signal CTR_CGS and the second charge sharing element 374 includes a fourth PMOS transistor PM14 having a source-drain connection between the second output terminal OUTb and the negative local I/O line LIOb and a gate to receive the charge sharing signal CTR_CGS.

According to the present invention, it is possible to make sense amplification fast by previously providing the data applied to the positive/negative local I/O lines LIO and LIOb for the first and second output terminals OUT and OUTb before the sense amplification of the sense amplifying unit 310 using the additionally provided charge sharing unit (including 372 and 374). Also, the differential data applied to the positive/negative local I/O lines LIO and LIOb can be safely transferred to the global I/O line GIO.

Here, the charge sharing signal CTR_CGS is activated before the I/O strobe signal IOSTP is activated and it is inactivated before the precharge signal CTR_PCG is activated. These activations will be described below referring to FIG. 5.

Figure 4:
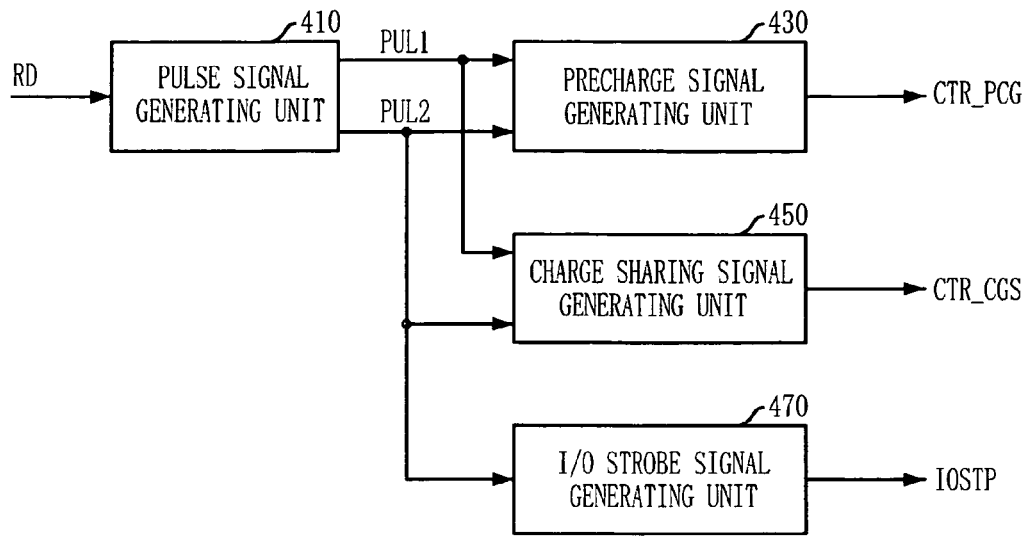
FIG. 4 is a block diagram illustrating a signal generating unit.

Meanwhile, according to the present invention, a signal generating unit (not shown in FIG. 3) can be added in the semiconductor memory device. The signal generating unit produces the precharge signal CTR_PCG, the charge sharing signal CTR_CGS and the I/O strobe signal IOSTP in response to the read command RD. FIG. 4 is a block diagram for illustrating the signal generating unit.

Referring to FIG. 4, the signal generating unit includes a pulse signal generating unit 410 for generating a first pulse signal PUL1 having information about the charge sharing time of the first and second output terminals OUT ad OUTb and for generating a second pulse signal PUL2 having information about the activation time of the sense amplifying unit 310 in response to the read command RD, a precharge signal generating unit 430 for producing the precharge signal CTR_PCG in response to the first and second pulse signals PUL1 and PUL2, a charge sharing signal generating unit 450 for producing the charge sharing signal CTR_CGS in response to the first and second pulse signals PUL1 and PUL2, and an I/O strobe signal generating unit 470 for producing the I/O strobe signal IOSTP in response to the second pulse signal PUL2. Here, the first pulse signal PUL1 can be a signal which is activated faster than the second pulse signal PUL2.

Figure 5:
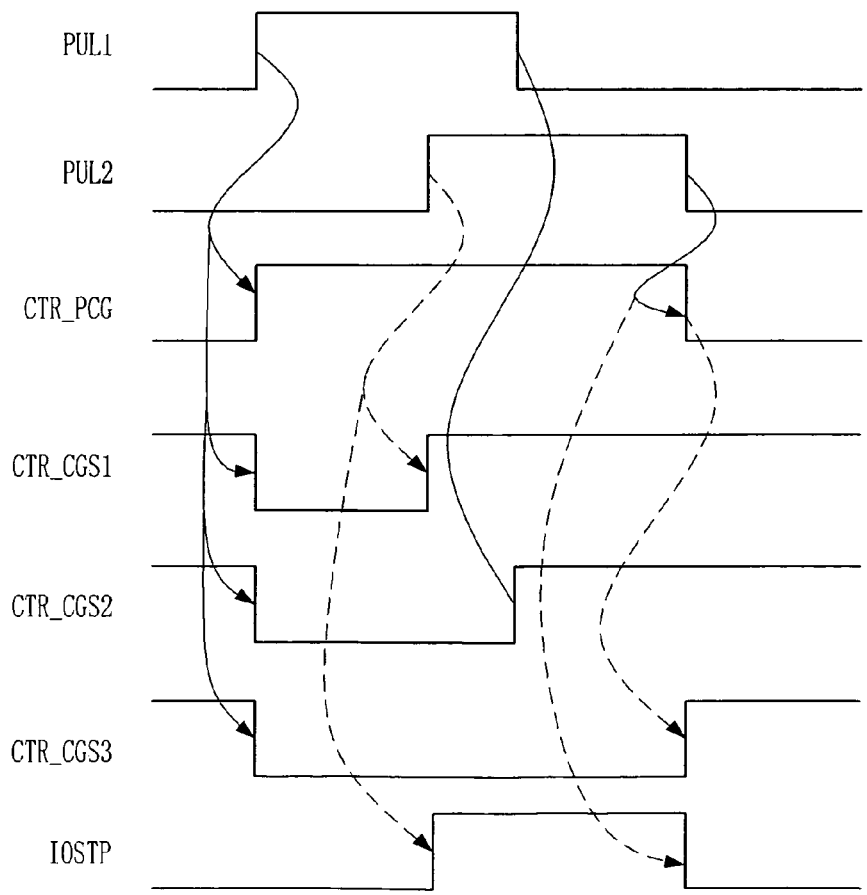
FIG. 5 is a timing diagram illustrating activation and inactivation timing of each signal of FIG. 4.

FIG. 5 is a timing diagram illustrating activation and inactivation timing of each signal of FIG. 4. In FIG. 5, three cases for producing the charge sharing signal CTR_CGS using the first and second pulse signals PUL1 and PUL2 are shown in FIG. 5. The first to third charge sharing signals, which are correspondent to the three cases, are shown by the reference numerals 'CTR_CGS1', 'CTR_CGS2' and 'CTR_CGS3', respectively.

Referring again to FIGS. 3 through 5, the operation according to the present invention will be described in detail based on only the first charge sharing signal CTR_CGS1. The pulse signal generator 410 produces first and second pulse signals PUL1 and PUL2 in response to the read command RD. The precharge signal CTR_PCG is inactivated from a low level to a high level in response to the activation time of first pulse signal PUL1 and first and second PMOS transistors PM11 and PM12 in the first of the precharging unit 330 are turned off, thereby stopping the precharging operation of the first and second output terminals OUT and OUTb.

The charge sharing signal CTR_CGS1 is activated in response to the activation time of the first pulse signal PUL1 and inactivated in response to the activation time of the second pulse signal PUL2. Accordingly, while the charge sharing signal CTR_CGS1 is activated, a third PMOS transistor PM13 of the first charge sharing part 372 is turned on and a fourth PMOS transistor PM14 of the second charge sharing part 374 is also turned on so that the charge sharing operation is carried out between the first and second output terminals OUT and OUTb and the corresponding positive/negative local I/O lines LIO and LIOb.

The I/O strobe signal IOSTP transits to a high level in response to the second pulse signal PUL2 and an NMOS transistor NM11 of the activation part 316 is then turned on, thereby activating the sense amplification of the sense amplifying unit 310.

Thereafter, the precharging operation is carried out in the first and second output terminals OUT and OUT, by activating the precharge signal CTR_PCG to a low level in response to the inactivation time of the second pulse signal PUL2 and then turning on the first and second PMOS transistors PM11 and PM12.

As a result, the differential data, which are applied to the positive/negative local I/O lines LIO and LIOb before the I/O strobe signal IOSTP is activated, are provided to the first and second output terminals OUT and OUTb. Therefore, after the I/O strobe signal IOSTP is activated, the first and the second output terminals OUT and OUTb can more rapidly obtain a voltage level which is capable of driving the pull-up/pull-down driving unit 350.

Here, the second charge sharing signal CTR_CGS2 operates based on the first pulse signal PUL1. That is, the second charge sharing signal CTR_CGS2 is activated in response to the activation of the first pulse signal PUL1 and is inactivated in response to the inactivation of the first pulse signal PUL1. Also, the third charge sharing signal CTR_CGS3 is activated in response to the activation of the first pulse signal PUL1 and inactivated in response to the inactivation of the second pulse signal PUL2. The third charge sharing signal CTR_CGS3 can operate in response to the precharge signal CTR_PCG. In this case, third charge sharing signal CTR_CGS3 is activated in response to the activation of the precharge signal CTR_PCG and inactivated in response to the inactivation of the precharge signal CTR_PCG.

In similar to the first charge sharing signal CTR_CGS1, the second and third charge sharing signals CTR_CGS2 and CTR_CGS3 are employed for securing a voltage level which can make the pull-up/pull-down driving unit 350 driven at the first and second output terminals OUT and OUTb.

Figure 6:
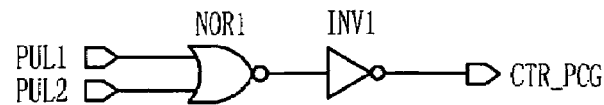
FIG. 6 is a circuit diagram illustrating a precharge signal generating unit of FIG. 4.

FIG. 6 is a circuit diagram illustrating the precharge signal generating unit 430 of FIG. 4. The precharge signal generating unit 430 includes a first NOR gate NOR1, which receives the first and second pulse signals PUL1 and PUL2, and a first inverter INV1 which inverts an output signal of the first NOR gate NOR1 to output the precharge signal CTR_PCG. Then, the precharge signal CTR_PCG is inactivated to a high level in response to the activation of the first pulse signal PUL1 and activated to a low level in response to the inactivation of the second pulse signal PUL2. It is preferable that the activation ranges of the first and second pulse signals PUL1 and PUL2 overlap each other in order to safely produce the precharge signal CTR_PCG.

Figure 7:
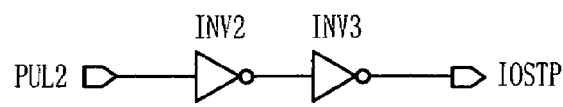
FIG. 7 is a circuit diagram illustrating an I/O strobe signal generating unit of FIG. 4.

FIG. 7 is a circuit diagram illustrating the I/O strobe signal generating unit 470 of FIG. 4. The I/O strobe signal generating unit 470 can include a second inverter INV2 which receives the second pulse signal PUL2 and a third inverter INV3 which receives an output signal of the second inverter INV2 in order to output the I/O strobe signal IOSTP.

Figure 8A:
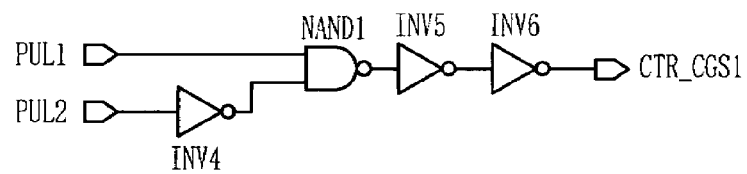
FIGS. 8a through 8c are circuit diagrams illustrating a charge sharing signal generating unit of FIG. 4.
Figure 8B:
Figure 8C:
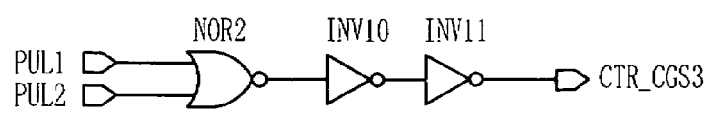

FIGS. 8a through 8c are circuit diagrams illustrating the charge sharing signal generating unit 450 of FIG. 4. The charge sharing signal generating unit 450 to generate the first charge sharing signal CTR_CGS1 in FIG. 8a includes a fourth inverter INV4 for inverting the second pulse signal PUL2, a NAND gate NAND1 for NANDing output signals of the fourth inverter INV4 and the first pulse signal PUL1, a fifth inverter INV5 for receiving an output signal of the NAND gate NAN1, and a sixth inverter INV6 for inverting an output signal of the fifth inverter INV5 and outputting the first charge sharing signal CTR_CGS1.

The charge sharing signal generating unit 450 to generate the second charge sharing signal CTR_CGS2 in FIG. 8b includes a seventh inverter INV7 for inverting the first pulse signal PUL1, an eighth inverter INV8 for inverting an output signal of the seventh inverter INV7, and a ninth inverter INV9 for inverting an output signal of the eighth inverter INV8 and outputting the second charge sharing signal CTR_CGS2.

The charge sharing signal generating unit 450 to generate the third charge sharing signal CTR_CGS3 in FIG. 8c includes a second NOR gate NOR2 for NORing the first and second pulse signals PUL1 and PUL2, a tenth inverter INV10 for inverting an output signal of the second NOR gate NOR2, and an eleventh inverter INV11 for inverting an output signal of the tenth inverter INV10 and outputting the third charge sharing signal CTR_CGS3.

Each of the first to third charge sharing signals CTR_CGS1, CTR_CGS2 and CTR_CGS3 is employed in embodiments of the present invention. All the first to third charge sharing signals CTR_CGS1, CTR_CGS2 and CTR_CGS3 are activated between the inactivation timing of the precharge signal CTR_PCG and the activation timing of the I/O strobe signal IOSTP, performs the charge sharing operation between the positive/negative local I/O lines LIO and LIOb and the corresponding output terminals OUT and OUTb, and stops performing the charge sharing operation before the activation of the precharge signal CTR_PCG.

Figure 9:
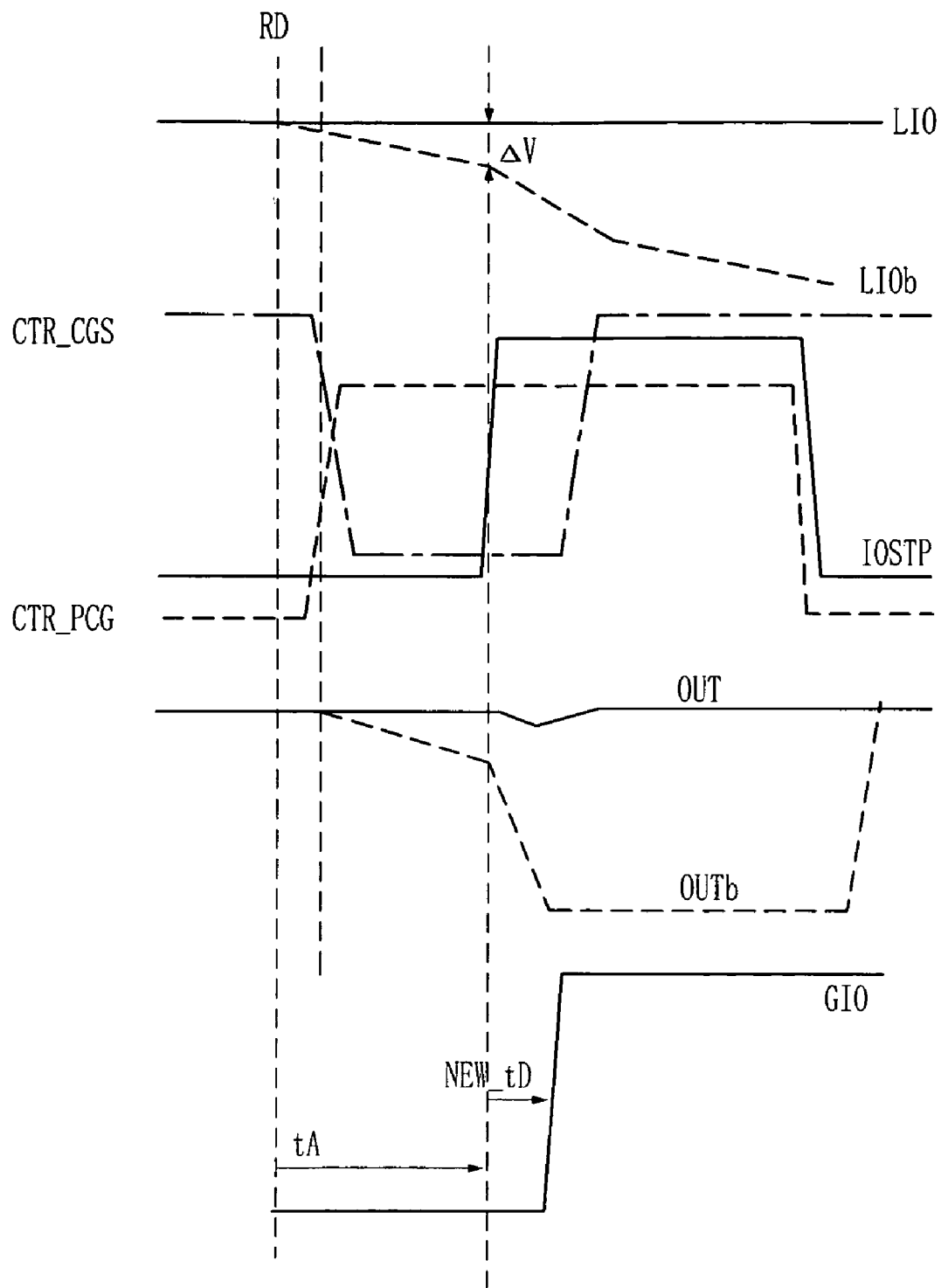
FIG. 9 is a timing diagram illustrating an operation of each signal of FIG. 3.

FIG. 9 is a timing diagram illustrating the positive/negative local I/O lines LIO and LIOb, the charge sharing signal CTR_CGS2, the precharge signal CTR_PCG, the I/O strobe signal IOSTP, the first and second output terminals OUT and OUTb and the global I/O line GIO. For the sake of convenience in illustration, the second charge sharing signal CTR_CGS2 will be described with other signals and it is assumed that high-level data are transferred through the positive local I/O line LIO and low-level data are transferred through the negative local I/O line LIOb.

Referring to FIG. 9, the precharge signal CTR_PCG is maintained in a low level before the read command RD is inputted and the first and second output terminals OUT and OUTb are precharged to a voltage level of an external supply voltage VDD. At this time, since the I/O strobe signal IOSTP is maintained at a low level, the I/O sense amplifying unit is in a standby state.

Thereafter, when the read command RD is inputted, the precharge signal CTR_PCG transits to a high level so that the precharge operation of the first and second output terminals OUT and OUTb is terminated. Also, at this time, the charge sharing signal CTR_CGS2 is activated to a low level so that the charge sharing operations are carried out between the positive/negative local I/O lines LIO and LIOb and the corresponding output terminals OUT and OUTb. That is, since the charge sharing operation is carried out between the negative local I/O line LIOb and the second output terminal OUTb while the voltage level of the negative local I/O line LIOb is gradually decreased, the voltage level of the second output terminal OUTb is also decreased based on the decreased voltage level of the negative local I/O line LIOb.

Subsequently, after the time (tA) required to guarantee the difference of more than ΔV between the voltage level of the positive local I/O line LIO and the voltage level of the negative local I/O line LIOb, the I/O strobe signal IOSTP is activated to a high level and then the amplification operation is performed. Therefore, the second output terminal OUTb goes to a low level due to the sense amplification.

As shown in FIG. 9, the second output terminal OUTb goes to a low level in advance through the charge sharing operation. Therefore, the first and second output terminals OUT and OUTb have a voltage level, which can drive the global I/O line GIO, through the sense amplification which is carried out for a period as much as the time of 'NEW_tD'. Therefore, after the read operation, it takes the time of 'tA+NEW_tD' to transfer the data from the positive/negative local I/O lines LIO and LIOb to the global I/O line GIO.

As described above, the sensing time is reduced and the pull-up and pull-down time is also reduced in the global I/O line GIO, by performing the charge sharing operation between the first and second output terminals OUT and OUTb and the corresponding positive/negative local I/O lines LIO and LIOb before the I/O sense amplifying unit operates.

As apparent from the above, in the present invention, the pull-up and pull-down time of the global I/O line GIO is reduced, by performing the charge sharing operation between the I/O sense amplifier and the local I/O lines before the I/O sense amplifying unit operates. Also, the operating speed of the semiconductor memory device can be increased by the high-speed sense amplification of the I/O sense amplifier.

While the present invention has been described with respect to the particular embodiments, it will be apparent to those skilled in the art that various changes and modifications may be made without departing from the spirit and scope of the invention as defined in the following claims. For example, in the above-described embodiment, the NMOS transistors are illustrated in the charge sharing elements; however, they are replaced with other kinds of transistors or switching devices. Furthermore, the positions and types of the logic gates and transistors exemplified in the above-described embodiment can be easily modified without departing from the spirit and scope of the invention. Moreover, in the above-described embodiment, although all the first to third charge sharing signals are used, it is possible to use other signals which are activated from the activation time of the precharge signal CTR_PCG, activated during the activation of the I/O strobe signal IOSTP, and inactivated before the inactivation time of the precharge signal CTR_PCG.

What is claimed is:

1. A semiconductor memory device comprising:
   a sense amplifying unit for amplifying data applied to a first data line in response to an I/O strobe signal;
   a precharging unit for precharging an output unit of the sense amplifying unit in response to a precharge signal;
   a charge sharing unit for performing a charge sharing operation between the first data line and the output unit before a sense amplifying operation of the sense amplifying unit; and
   a driving unit for driving a second data line in response to an output signal of the sense amplifying unit.

2. The semiconductor memory device of claim 1, wherein the first data line has a first positive data line and a first negative data line and wherein the sense amplifying unit has first and second output terminals which are correspondent to the first positive and negative data lines, respectively.

3. The semiconductor memory device of claim 2, wherein the sense amplifying unit includes:
   a differential input unit for receiving the data which are differential data applied to the first positive and negative data lines;
   a differential amplifying unit for amplifying the differential data inputted from the differential input unit and outputting amplified data to the first and second output terminals; and
   an activation unit for activating the differential input unit in response to the I/O strobe signal.

4. The semiconductor memory device of claim 3, wherein the charge sharing unit includes:

a first charge sharing element for performing a charge sharing operation between the first positive data line and the first output terminal in response to a charge sharing signal which is activated before the sense amplifying operation of the sense amplifying unit; and a second charge sharing element for performing a charge sharing operation between the first negative data line and the second output terminal in response to the charge sharing signal.

5. The semiconductor memory device of claim 4, wherein the first charge sharing element includes an NMOS transistor which has a source-drain connection between the first output terminal and the first positive data line and a gate to receive the charge sharing signal.

6. The semiconductor memory device of claim. 4, wherein the second charge sharing element includes an NMOS transistor which has a source-drain connection between the second output terminal and the first negative data line and a gate to receive the charge sharing signal.

7. The semiconductor memory device of claim 4, wherein the charge sharing signal is a signal which is activated before an activation of the I/O strobe signal and inactivated before an activation of the precharge signal.

8. The semiconductor memory device of claim 4, wherein the charge sharing signal is a signal which is produced in response to the precharge signal.

9. The semiconductor memory device of claim 4, further comprising a signal generating unit for generating the precharge signal, the charge sharing signal and the I/O strobe signal in response to a read command.

10. The semiconductor memory device of claim 9, wherein the signal generating unit includes:

a pulse signal generating unit for generating first and second pulse signals in response to the read command, wherein the first pulse signal has information about a charge sharing timing of the first and second output terminals and wherein the second pulse signal has information about an activation of the sense amplifying unit;

a precharge signal generating unit for generating the precharge signals in response to the first and second pulse signals of the pulse signal generating unit;

a charge sharing signal generating unit for generating the charge sharing signal in response to the first and second pulse signals of the pulse signal generating unit; and an I/O strobe signal generating unit for generating the I/O strobe signal in response to the first and second pulse signals of the pulse signal generating unit.

11. The semiconductor memory device of claim 10, wherein the first pulse signal is a signal which is activated faster than the second pulse signal.

12. The semiconductor memory device of claim 10, wherein an activation section of the first pulse signal overlaps with that of the second pulse signal.

13. The semiconductor memory device of claim 10, wherein the precharge signal is a signal which is inactivated in response to an activation of the first pulse signal and activated in response to an inactivation of the second pulse signal.

14. The semiconductor memory device of claim 10, wherein the charge sharing signal is a signal which is activated in response to an activation of the first pulse signal and inactivated in response to an activation of the second pulse signal.

15. The semiconductor memory device of claim 10, wherein the I/O strobe signal is a signal which is produced in response to the second pulse signal.

16. A method for driving a semiconductor memory device, which has a sense amplifying unit for sensing and amplifying data applied to a first data line, comprising the steps of:

precharging an output unit of the sense amplifying unit in response to a precharge signal;

amplifying the data applied to the first data line in response to an I/O strobe signal; and performing a charge sharing operation between the first data line and the output terminals of the sense amplifying unit in response to a charge sharing signal which is activated before amplifying the data applied to the first data line.

17. The method of claim 16, wherein the charge sharing signal is a signal which is activated before an activation of the I/O strobe signal and inactivated before an activation of the charge sharing signal.

18. The method of claim 16, wherein the charge sharing signal is a signal which is produced in response to the precharge signal.

19. The method of claim 16, further comprising a signal generating unit for generating the precharge signal, the charge sharing signal and the I/O strobe signal in response to a read command.

20. The method of claim 19, wherein the step of generating the signals includes the steps of:

generating a first pulse signal in response to the read command, wherein the first pulse signals has information about a charge sharing timing of the output unit of the sense amplifying unit; and generating a second pulse signal in response to the read command, wherein the second pulse signal has information about an activation of the sense amplifying unit.

21. The method of claim 20, wherein the first pulse signal is a signal which is activated faster than the second pulse signal.

22. The method of claim 20, wherein an activation section of the first pulse signal overlaps with that of the second pulse signal.

23. The method of claim 20, wherein the precharge signal is a signal which is inactivated in response to an activation of the first pulse signal and activated in response to an inactivation of the second pulse signal.

24. The method of claim 20, wherein the charge sharing signal is a signal which is activated in response to an activation of the first pulse signal and inactivated in response to an activation of the second pulse signal.

25. The method of claim 20, wherein the I/O strobe signal is a signal which is produced in response to the second pulse signal.

* * * * *